United States Patent [19]

Sakuraba et al.

[11] Patent Number: 4,903,234
[45] Date of Patent: Feb. 20, 1990

[54] MEMORY SYSTEM

[75] Inventors: Taketoshi Sakuraba, Yokohama; Hisashi Katada, Sagamihara; Yoshitaka Ohfusa, Yokohama; Yasufumi Yoshizawa, Tachikawa; Toshiaki Arai, Kawasaki; Hiroo Miyadera, Atsugi, all of Japan

[73] Assignee: Hitachi, Ltd., Tokyo, Japan

[21] Appl. No.: 196,538

[22] Filed: May 20, 1988

[30] Foreign Application Priority Data

May 22, 1987 [JP] Japan ................. 62-123794

[51] Int. Cl.⁴ .................. G11C 13/00; G11C 15/00
[52] U.S. Cl. .................. 365/49; 365/189.01; 365/189.05; 365/230.03; 365/220
[58] Field of Search ............... 365/49, 189, 200, 230, 365/189.01, 189.05, 230.03

[56] References Cited

U.S. PATENT DOCUMENTS 4,168,541  9/1979  DeKarske ............... 365/200
4,685,082  8/1987  Cheung et al. ........... 365/200

Primary Examiner—Terrell W. Fears
Attorney, Agent, or Firm—Pennie & Edmonds

[57] ABSTRACT

In a memory system having a storage device and a key storage keeping key data controlling an access to the storage device, there is disposed a key address translation structure for obtaining an address of an entry of the key storage based on an address of the storage device to which an access request is issued. As a result, when subdividing the storage device according to the key data setting unit, each subdivided area can be assigned with a variable size and a plurality of sizes are enabled to be specified for the key data setting units at the same time.

18 Claims, 10 Drawing Sheets

SETSKMSK  $R_1$, $R_2$ $R_1$: | BANK NO. |

$R_2$: | MASK PATTERN |

GETSKMSK  $R_1$, $R_2$ $R_1$: | BANK NO. |

$R_2$: | MASK PATTERN |

MEMORY SYSTEM

BACKGROUND OF THE INVENTION

1. Field of the Invention

The present invention relates to a memory system, and in particular, to a key storage and a controller thereof to be added to a real storage device in an information processing apparatus such as a computer.

2. Description of the Related Art

In a control of the real storage device or the main memory device of an information processing apparatus, the storage or memory area is subdivided into real storage blocks each having a fixed size and there are disposed a storage key for each real storage block for a memory management and for a check to determine whether data in the real storage is accessible from a program. An access protection key and an access inhibit bit of a storage key are provided to prevent data and a program in the real storage from being destroyed by mistake or by intention and from being stolen, respectively. Namely, these items are employed to check for a matching condition between the access protection key and a key specified to a program being run in the system. If the matching condition is not satisfied, only a program exception interruption can be caused to take place, for example, to effect a control to stop the run of the program which has attempted an invalid access.

Furthermore, in a system in which a virtual memory system is adopted to effect a paging operation, the real storage block is called a page such that a replacement processing, that is, a paging operation is achieved in a unit of the page by means of an auxiliary storage apparatus. In such a system, in order to determine which one of the pages is to be moved from the real storage to the auxiliary storage, there are provided a reference bit and a change bit in the real storage key. For example, when the reference bit is not on for a page, it is assumed that the page is not used for a relatively long period of time and is hence judged to be moved to the auxiliary storage. Moreover, when the change bit is not on for a page, it is considered that the content of the page is not changed after the previous paging operation and that the data in the auxiliary storage can be utilized again, namely, the actual input/output operation for the paging operation need not be achieved.

Since an allocation of the real storage to a job need only be carried out in a unit of the page described above, it is sufficient to provide a real storage key including a reference bit and a change bit for each page.

For an efficient method of implementing the virtual memory system, the storage is subdivided into pages each having a fixed size such that the page is employed as a unit of the allocation of the storage. This enables an arbitrary free page of the main storage to be allocated and hence the unitization efficiency of the main storage is increased. In a general-purpose computing system, the size of each page is fixedly determined to be 2KB or 4KB in general. However, due to the development of the semiconductor integration technology of late years, a main storage apparatus having a large memory capacity can be realized at a low cost; consequently, without changing the page size of the conventional system, the overhead time of the management becomes to be considerably increased in the operating system. That is, since the number of tables managing the respective pages becomes greater, there arises a difficult problem that the memory volume and the period of time required to search for a page are greatly increased.

In order to solve this problem, a large page need only be allocated; however, since the memory configuration is to be dynamically changed when a memory failure and a variation in the load occur, the conventional page size should be adopted as the basic size such that a page of an arbitrary size is implemented when required. However, if this provision is realized, there exist a plurality of storage keys for a large page, which leads to a problem associated wit a consistency of the storage key. This is because the processors which reference the main storage include an input/output processor in addition to a central processing unit (CPU); furthermore, there exist many programs generated for the conventional page size and hence the compatibility thereof is required to be sustained. A method to solve the problem above is that the operating system guarantees the same key value for all storage keys belonging to a large page. However, when the page size is increased, the number of storage keys also becomes to be greater, and hence the overhead to effect processing for setting and for referencing the storage keys is increased. For example, assuming the basic page size to be 4KB, for an implementation of a large page with a page size of 1MB, the system is required to guarantee the consistency of 256 storage keys, which considerably increases the overhead associated with the page allocation, page replacement, and page input/output operations.

Reference may be made to JP-A-61-165156.

SUMMARY OF THE INVENTION

It is therefore an object of the present invention to provide a memory control apparatus which reduces the overhead of the operating system managing the real storage apparatus.

Another object of the present invention is to provide means in an information processing apparatus having a virtual memory system which supports a variable page size as the allocation unit to the real storage apparatus of the information processing apparatus and which guarantees the consistency of storage keys corresponding to the respective pages thereof.

Still another object of the present invention is to implement a storage control apparatus which minimizes the amount of the storage keys required in the system.

In order to achieve the objects above, according to the present invention, there is provided a memory system having a main storage apparatus including a plurality of subdivided areas, a key storage containing storage keys assigned to the respective plural areas of the main storage apparatus, and a main storage control apparatus controlling the main storage apparatus and an access to the key storage wherein the main storage control apparatus comprises a key address translation structure for attaining address information of an entry of the key storage based on address information of the main storage apparatus to which an access request is issued and means disposed for the key address translation structure for setting the area to which the storage key is set.

According to the present invention, with the provision of the key address translation mechanism, the size (capacity) and the number of subdivided areas of the main storage can be arbitrarily specified, which enables the information processing system utilizing the memory system to be operated in a flexible fashion.

As will be described in conjunction with an embodiment, in a case where the size and the number of the subdivided areas are variable and a single storage key is assigned to an area, the capacity of the high-priced key storage requiring a high-speed access can be considerably reduced.

Furthermore, as will be described in conjunction with another embodiment, in a case where the memory system according to the present invention is applied to the conventional so-called virtual memory system, consecutive real pages each having the same page size of the real storage apparatus are employed as the subdivided areas in the virtual memory system. Assuming that the area is a logical page and that a logical page is associated with a plurality of real pages, the identicalness of the plural storage keys corresponding to a logical page is guaranteed by setting a representative storage key for the plural storage keys by means of the key address translation mechanism. Moreover, since logical pages having various sizes are prepared according to the present invention, a main storage area corresponding to a program request can be allocated so as to increase the utilization efficiency of the main storage. In addition, the adoption of the page management table enables the storage overhead and the processing overhead to be reduced; furthermore, the number of paging operations and the number of swapping operations are minimized and hence the overhead associated therewith can be reduced. As for the advantageous feature for the user, since a large main storage area can be allocated, the number of page faults is reduced and hence the execution speed is increased. Moreover, in order to implement this method, only the memory management part or section is to be modified in the operating system, namely, the other programs of the operating system are kept unchanged. This can be achieved by allocating the pages of the conventional size to the operating system generated for the conventional page size and to the working areas thereof and by allocating logical pages to general user's programs.

The above mentioned and other features and objects of this invention will become more apparent by reference to the following description taken in conjunction with the accompanying drawings.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1:
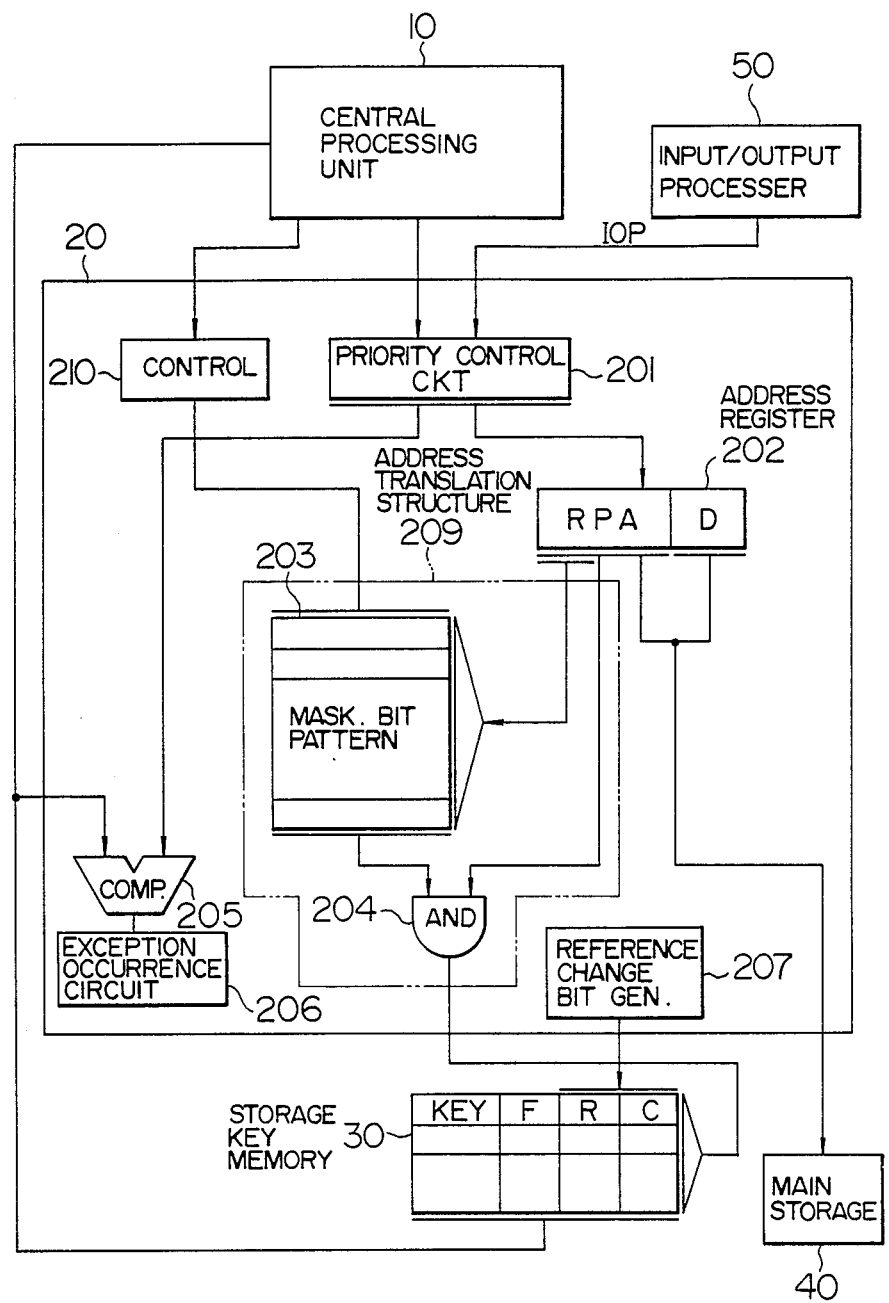
FIG. 1 is a block diagram showing the configuration of an embodiment of the memory system according to the present invention.

FIG. 1 shows the configuration of an embodiment of the memory system according to the present invention.

Access requests to a main storage device 40 from a central processing unit 10 and from an input/output control processor 50 are supplied to a priority control circuit 201. In the priority control circuit 201, one of the access requests sent from the central processing unit 10 and the I/O control processor 50 is selected, and a main storage address contained in the access request thus selected is stored in a real address register 202. The main storage address is used for the access control of the main storage device 40.

A portion of the content of the real address register 202 is delivered to an address translation structure or mechanism calculating an address of a storage key memory 30 which is an essential portion of the present invention.

The storage key memory 30 includes a storage key comprised of an access control bit Key, a protection bit F, a reference bit R, and a change bit C corresponding to each area attained by subdividing the recording area of the main storage device 40.

A storage key obtained from the storage key memory 30 is fed to a comparator circuit 205 so as to be employed for a check determining the validity of the access request to the main storage device 40. If the access request is invalid, an exception occurrence circuit 206 initiates an operation thereof and causes an interruption to the processor 10 or 50 of the access request source, thereby notifying the occurrence of the exception. In a case of a valid access request, an access is achieved to the main storage device 40, and at the same time, depending on the pertinent instruction, a reference/change bit generate circuit 207 sets the reference bit P and the update or change bit C of the storage key 30.

A control section 210 changes or references the content of an address translation structure or mechanism 209 according to an instruction from the processor 10.

In the constitution above, the components are the same as those of the conventional known memory system excepting the address translation structure 209, the storage key memory 30, and the control section 210; consequently, detailed description thereof will be omitted.

Figure 2:
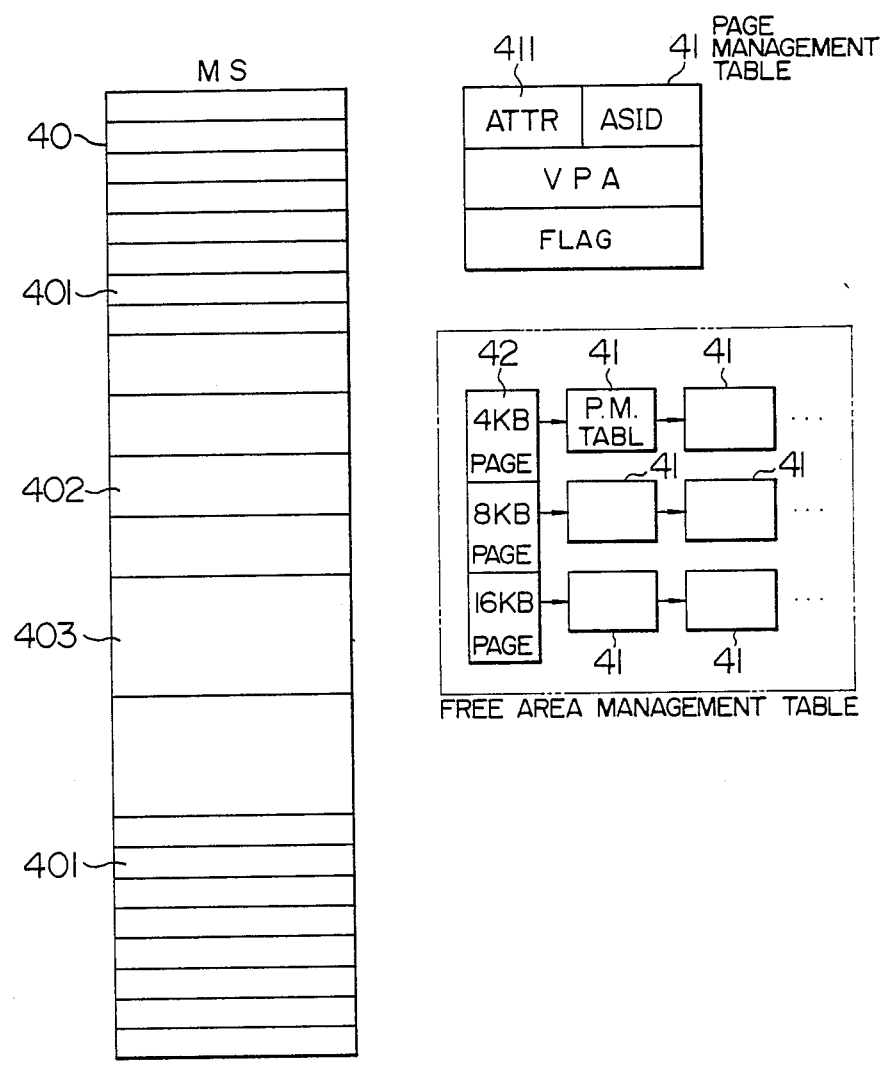
FIG. 2 is configuration diagrams of a main storage and management tables employed in the embodiment of FIG. 1.

FIG. 2 shows an embodiment of the configuration of the storage area of the main storage device 40.

In this embodiment, in order to attain applicability thereof to a virtual memory system, the main storage area is subdivided into subareas each having a capacity of 32KB (the subarea is called a bank), and each bank is further partitioned into logical pages each having the same size. This provision intends to minimize the constitution of the hardware determining a representative storage key of logical pages, which will be described later in this specification.

In the configuration of FIG. 2, there are shown the banks subdivided into pages having page sizes of 4KB, 8KB, and 16KB, respectively and tables disposed to manage these pages. The main storage device 40 is subdivided into 32KB banks and then each bank is further subdivided into logical pages including 4KB pages 401, 8KB pages 402, and 16KB pages 403 having page sizes of 4 kb, 8 kb, and 16 kb, repectively. Tables 41 each disposed to manage a logical page are of the same constitution regardless of the size of the pertinent logical page. The page management table 41 includes a page attribute 411, a number ASID of a virtual memory space to which a main storage area is allocated, a virtual address VPA of the allocated virtual space, and other control information FLAG. The logical page size is stored in the page attribute 411 so as to be used by the operating system for the page allocation and for the paging operation. A free area management table and allocation area management table are configured as indicated by reference numeral 42 in which pertinent logical pages are queued to form a chain for each page size.

Figure 3:
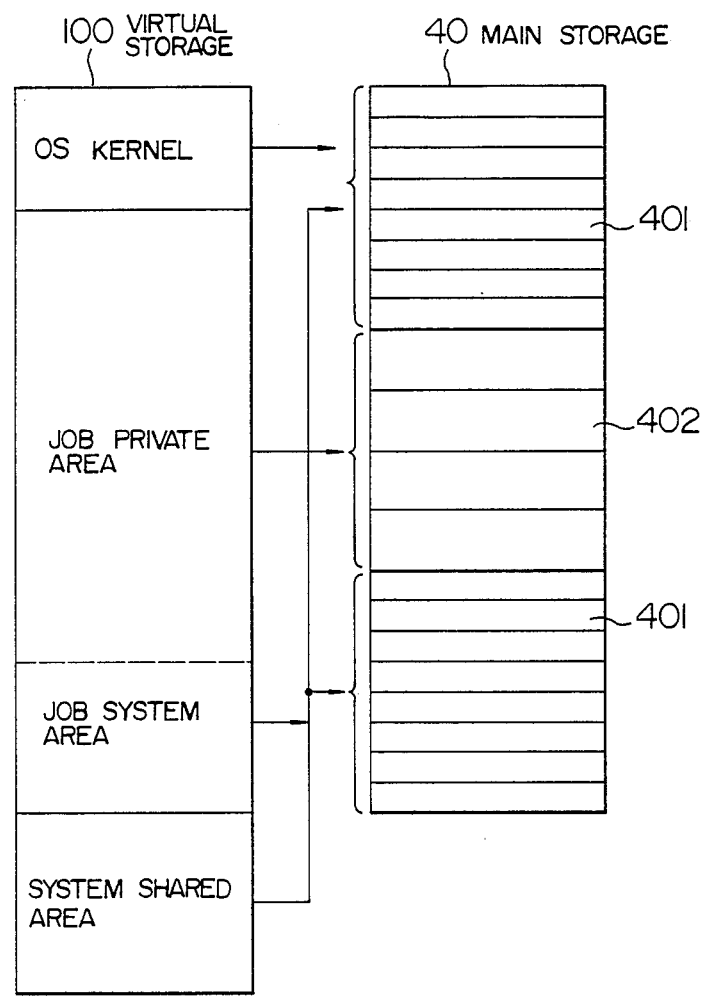
FIG. 3 is a constitution diagram showing an example of the allocation of logical pages to virtual storage areas.

FIG. 3 shows the logical page allocation with respect to areas of the virtual storage space 100. The virtual memory or storage space 100 is subdivided into an operating system (OS) kernel, a job private area, a job system area, and a system shared area. In a case of a request for large area of the job private area, the system allocates a logical page of which the page size is greater than the basic page size. Since such a large-area request is rarely issued for the other areas, the 4KB basic pages are allocated thereto.

Figure 4:
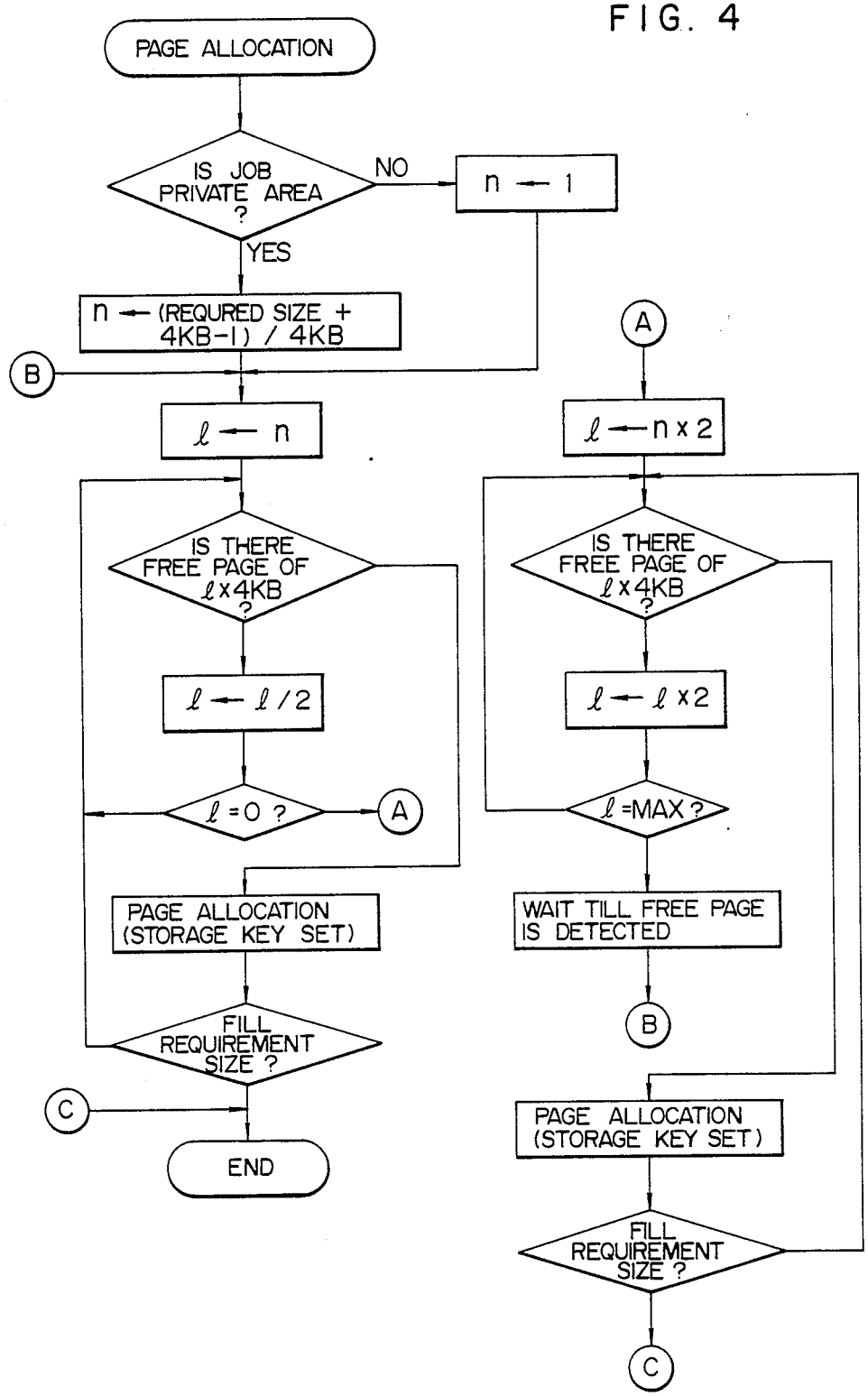
FIG. 4 is a flowchart showing a logical page allocation in the embodiment of FIG. 1.

FIG. 4 shows a method to allocate a page of an optimal size from the logical pages. For an area request from a program, the memory management part of the operating system checks to determine whether or not the virtual storage area associated with the request is the job private area. If this is the case, the operating system calculates a ratio of the length of the requested area to that of the basic page; otherwise, the ratio is set to one. Next, an attempt is made to attain a free logical page associated with the ratio of the basic page. If such a page is found, the page is allocated, and the operations above are repeatedly achieved until the requested length of the area is obtained; otherwise, the ratio is divided by two so as to search for a free logical page of the smaller size. When the ratio becomes to be 0, namely, when there does not exist a page of which the page size is smaller than the requested length of the area, an attempt is made to find a free logical page having a larger page size. If this attempt results in a failure, the pertinent request is set to the wait state until free pages are found.

The functions of the operating system necessary for implementing the logical pages have been described. Next, description will be given of a storage device which guarantees, in a case where a plurality of storage keys belong to a logical page, the consistency of the values of the storage keys.

In FIG. 1, of the real address stored in the real address register 202, the real page address (RPA) excepting the field of the displacement (D) in a page is used as an address to access a storage key, a portion of this address RPA excepting five low-order bits is employed to select an entry from an address mask register 203. A mask bit pattern as an output from the address mask register 203 and the address RPA are fed to an AND circuit 204, which produces an ANDed result therebetween. The attained logical product is utilized as an address to be supplied to the storage key memory 30. That is, the address RPA is translated into a real page address by means of the address mask register 203 and the AND circuit 204.

Figures 5, 7:
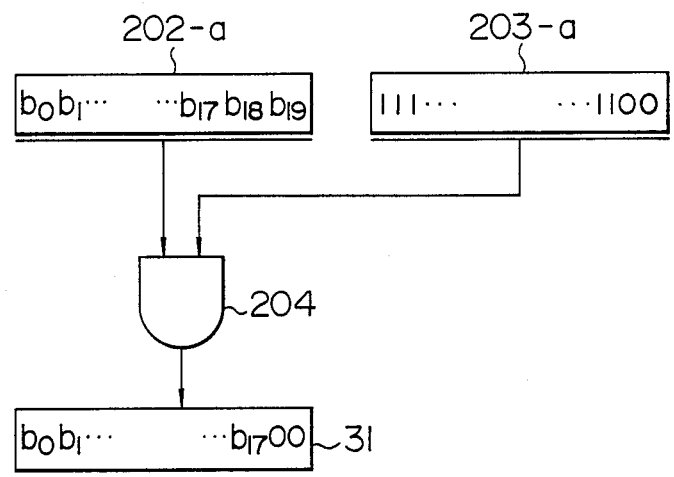
FIGS. 5 and 6 are explanatory diagrams useful to explain operations to determine a representative storage key in the embodiment of FIG. 1.
FIG. 7 is signal diagrams of instructions to effect a change and a reference of an address mask register in a control section 210 of FIG. 1.
Figure 6:
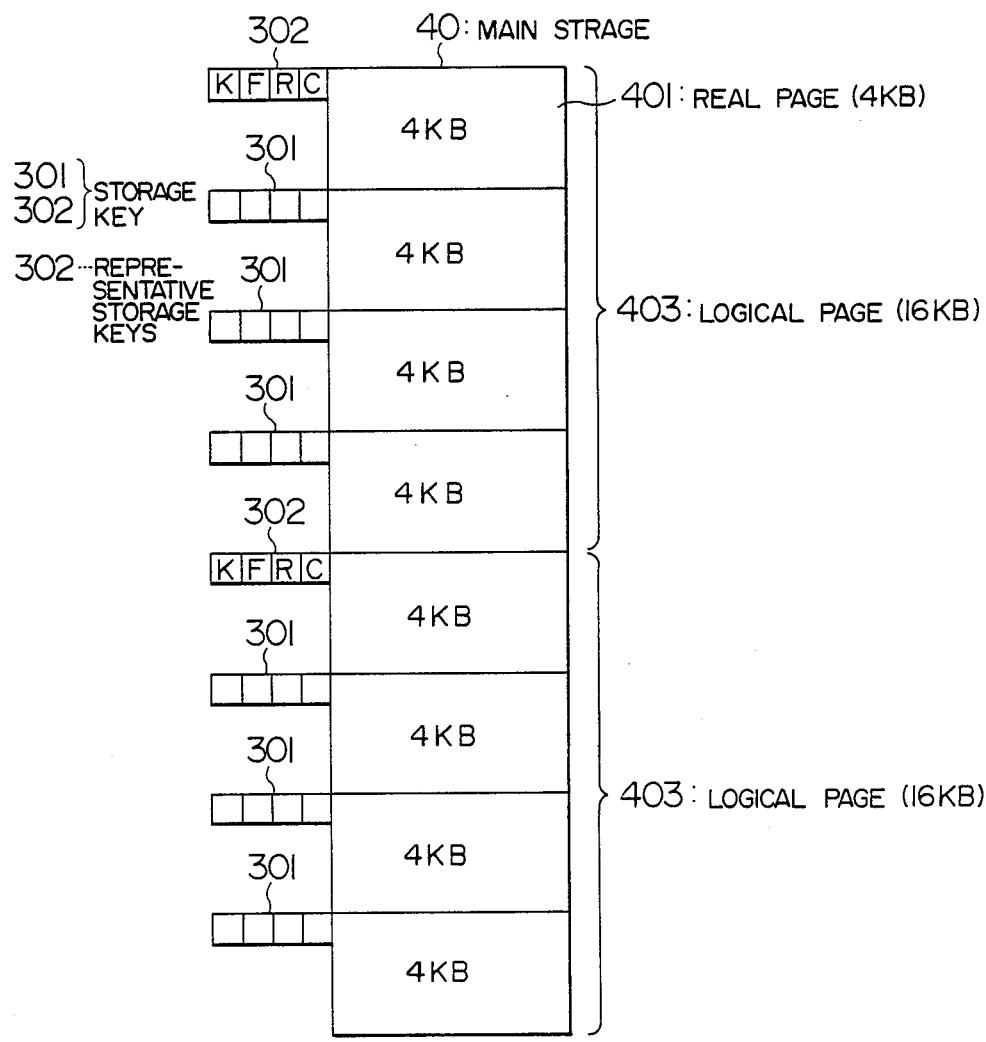

Referring now to FIG. 5, the procedure of the address translation will be described in detail. A real address RPA 202-a of the real address register 202 has a length of 19 bits. This is also the case with an output 203-a delivered from the address mask register 203 selected by use of the real address RPA. Assuming here that the size of the logical page is 16KB (namely, four times the page size of the basic page), a storage key located at the first position of the logical page is to be assigned as the representative storage key; consequently, two low-order bits of the output 203-a from the address mask register 203 become 0s. ANDing the outputs 202-a and 203-a to attain a logical product therebetween, two low-order bits of the address 31 of the storage key become 0s. As a result, regardless of the bits 18 and 19 of the real address RPA, there are attained the same storage key addresses, namely, the references to storage keys belonging to a logical page result in the storage key of the first page in a plurality of real pages corresponding to the logical page. FIG. 6 shows relationships between the storage keys and the representative storage key in this situation. Although four storage keys are included in a logical page 403, only the first storage key 30 is referenced.

The content of the address mask register 203 can be changed and/or referenced, for example, by use of instructions shown in FIG. 7. Instruction SETSKMSK can register a mask to an arbitrary entry of the address mask register 203 by respectively setting a bank number and a mask pattern to registers R1 and R2 located in the control circuit 210.

Instruction GETSKMSK, when executed with a bank number set to the register R1, causes a mask pattern of the pertinent entry to be loaded in the register R2.

According to the embodiment of FIG. 1, due to the implementation of the logical pages, the number of page management tables can be minimized; consequently, the utilization efficiency of the main storage device is increased. For example, when the conventional 4KB page size is adopted in a main storage having a memory capacity of one gigabyte (GB), 256 kilo (K) page management tables are required; however, according to the present invention, when the logical page is of one megabyte (MB) and ¾ of the main storage is employed as logical pages, the number of page control tables can be reduced to 64K+768. Since a page management table has a size of about 20 bytes (B) in general, 4MB of the main storage can be efficiently utilized in this example. In the future, the capacity of the main storage device is considered to become greater at an increasing tempo, and hence the effect of the present invention is to be highly appreciated. Furthermore, the reduction in the number of page management tables is also effective to minimize the CPU overhead with respect to the operating system for the table search. For main storage, the memory management checks all page management tables so as to search for pages which can be subjected to the page out operation. If there does not exist any pages to be subjected to the page out operation, the page management sets a more restricted page-out condition and then checks the page management tables again. Consequently, in the worst case, the page search operation is to be repeatedly effected (page number x 6) times. In the example above, the overhead can be reduced by a maximum of 1M search operations.

Moreover, the logical page constitution enables the page size to be increased and hence contributes to the reduction of the page faults and the number of paging control tables.

In contrast with a case where the operating system guarantees the consistency of the storage keys in a logical page, the consistency is guaranteed by use of a structure according to the present invention, which leads to an effect that operations to reference and to update storage keys in the page allocation and page out operation can be accomplished at a higher speed. When a logical page is of 1KB, 256 storage keys are used in the logical page; consequently, the number of operations to reference and to update the storage keys becomes 256 times.

Figure 8:
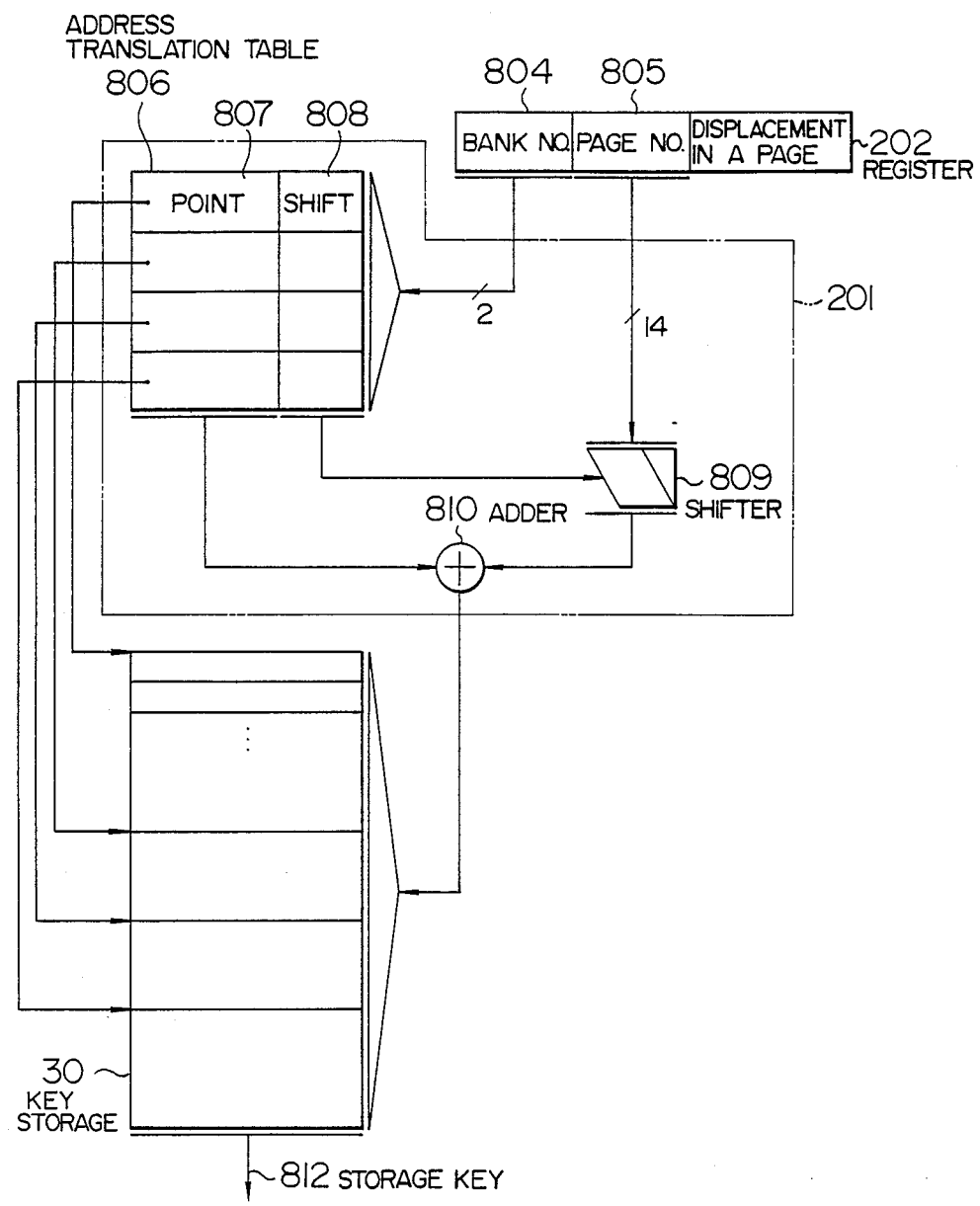
FIG. 8 is a configuration diagram showing configurations of the key address translation structure or mechanism and the key storage in another embodiment of the memory system according to the present invention.

FIG. 8 shows another embodiment of the memory system according to the present invention in which the capacity of storage keys is particularly reduced, namely, the main storage device is subdivided into a plurality of areas having an arbitrary area size and a storage key is assigned to each area.

In the configuration of FIG. 8, the components having the same functions as those of FIG. 1 are assigned with the same reference numerals. Furthermore, the components other than the blocks 30, 201 and 202 are identical to those of FIG. 1 and hence are not shown in FIG. 8.

Figure 9:
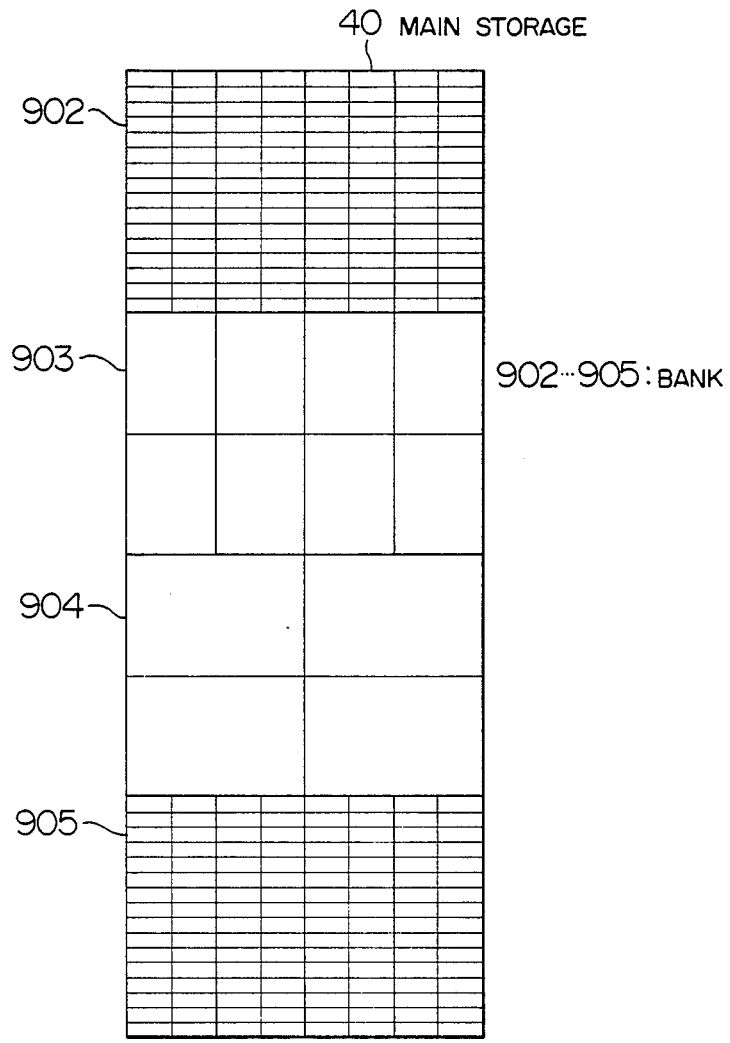
FIG. 9 is a schematic diagram showing the layout of the main storage corresponding to the embodiment of FIG. 8.

According to this embodiment, a key storage 30 is provided as follows. Namely, a real storage or a main storage 40 therein is subdivided into a plurality of recording areas (pages) respectively having a plurality of area sizes, as shown in FIG. 9, such that a key storage is disposed for each page thus established.

In the following description of the embodiment, the capacity of the main storage 40 and the size of the bank are assumed to be 256MB ($2^{28}$ bytes) and 64MB ($2^{26}$ bytes), respectively. The page sizes of the first bank 902, the second bank 903, the third bank 904, and the fourth bank 905 are assumed to be 4KB ($2^{12}$ bytes), 64KB ($2^{16}$ bytes), 1MB ($2^{20}$ bytes), and 4KB, respectively.

In FIG. 8, a real address is inputted to the address register 202 in association with the real storage access request.

In the embodiment above, the real address includes 28 bits in which the two leading bits indicate a bank number 104, namely, a bank index designating an entry of a translation table 806. The 14 intermediate bits subsequent to the bank number 804 associated with the real address 202 denote a page number assigned in a unit of 4KB in the bank. The 12 remaining bits are not used in the procedure to be described below.

Each entry of the translation table 806 comprises a pointer part or field 8 indicating a first address of the key storage entry of the page in the pertinent bank and a shift part or field 808 reflecting a page size.

The page number 805 is shifted to the right by means of a shifter 809 so as to attain a relative address relative to the first key storage entry of the pertinent bank. The shift count in this operation is determined by the page size of the bank and is indicated by the shift field 808 of the translation table 806. In other words, the shift field 808 is loaded with a shift count corresponding to the page size. An example or the shift count according to this embodiment is that the page size of the first bank 902 is 4KB ($2^{12}$ bytes) and hence the shift operation is not required, namely, the shift field 808 contains a value of 0. The page size of the second bank 903 is 4KB ($2^{16}$ bytes) and hence the shift field 808 of the entry in the translation table 806 of the pertinent bank contains a value of 4. The page size of the third bank 904 is 1MB ($2^{20}$ bytes) and in consequence the shift field 808 contains a value of 8. For the fourth bank 905, the value of the shift field 808 is 0 like in the case of the first bank. In general, since the minimum page size is set to 4KB ($2^{12}$ bytes), the pertinent shift field 808 is loaded with $N-12$ for a bank having a page size of $2^N$ bytes.

An output thus obtained from the shifter 909 is added to the value of the point field 807 of the pertinent bank by means of an adder 810, thereby attaining a page address of the page associated with the key storage 30.

The value of the point field 807 of the translation table 806 points, as described above, a head or leading address of a list of key storage entries of the respective bank. The address can be calculated from a page size of each bank having a bank number less than that of the pertinent bank, which will be here described according to the present invention. First, the point field corresponding to the first bank contains a value of 0. Next, since the point field of the second bank points a location immediately after the list of all key storage entries of the first bank and is hence loaded with a value of $2^{14}$ in this embodiment. This value is attained by dividing the bank size $2^{26}$ by the page size $2^{12}$. The point field of the third bank contains the sum of the page numbers of the first and second banks. The page number of the second bank is $2^{10}$ obtained by dividing the bank size $2^{26}$ by the page size $2^{16}$. Consequently, a value of $2^{14}+2^{10}$ is stored in the point field of the third bank. In the similar fashion, the point field of the fourth bank is loaded with a value of $2^{14}+2^{10}+2^6$.

Operations to set a value to the translation table and to read a value therefrom are achieved by use of instructions prepared therefor, namely, SETKS and GETKS, respectively. These two instructions are privileged instructions, which are utilized only by the control program.

Figure 10:
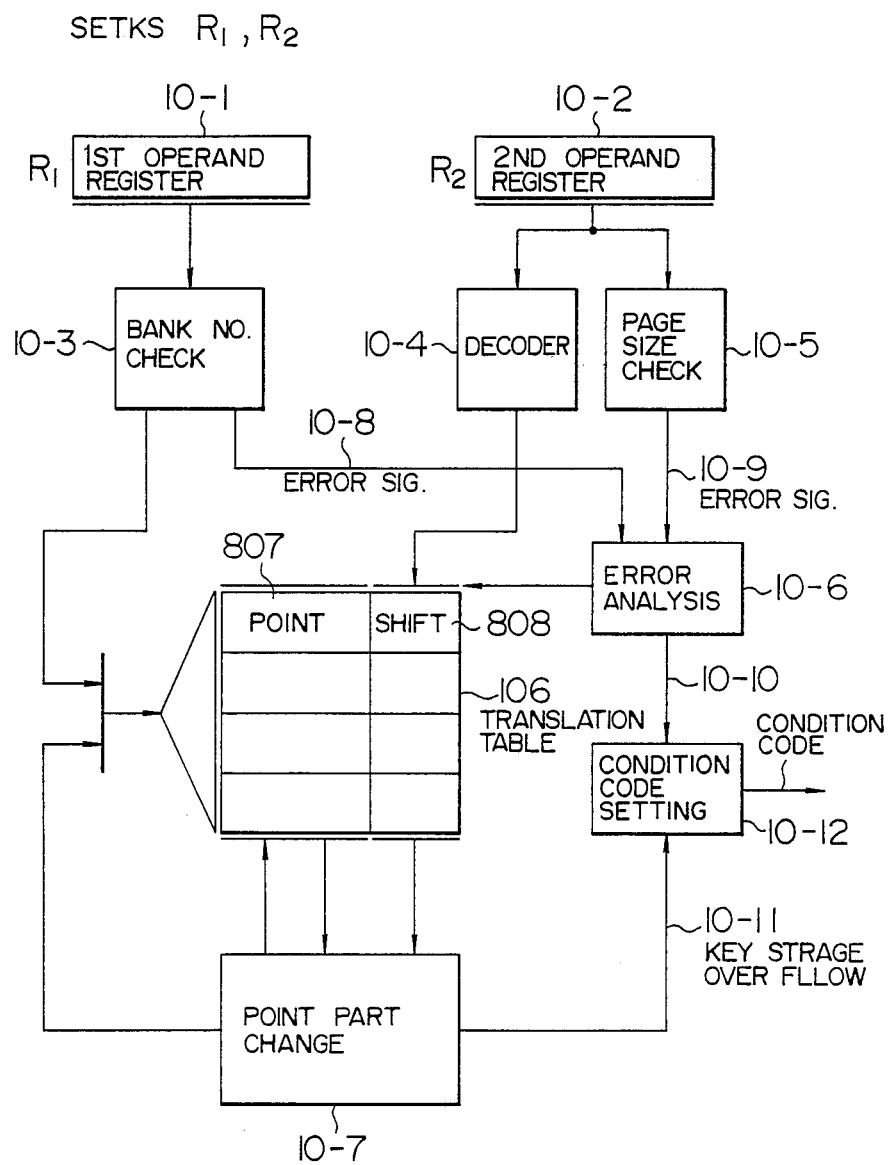
FIGS. 10 and 11 are explanatory diagrams useful to explain operations of the address translation structure in the embodiment of FIG. 8.

Referring now to FIG. 10, description will be given of the operation of the SETKS instruction. When this instruction is issued, two general-purpose registers 10-1, 10-2 are specified as operands. A bank number is specified in a first operand register 10-1 and is used to select an entry in the translation table 806. A page size of the bank is loaded in a second operand register 10-2. This value is converted into a shift count by a decoder 10-4 and is then stored in the shift field of the selected entry of the translation table 806. Under these conditions, the input data is checked as follows. In a case where the value specified in the first operand register 10-1 indicates a bank number which is not mounted in the system, a bank number check section 10-3 produces an address error signal 10-8. Furthermore, a page size check section 10-5 effects a judgement to determine whether or not the value contained in the second operand register 10-2 is valid, namely, whether or not only a bit is only 1, whether or not the value is at least 4KB, and whether or not the value is at most equal to the bank size. If an error is found, a page size error signal 10-9 is generated. The error signals 10-8 and 10-9 are also inputted to an error analyze section 10-6, and at an error occurrence, a signal inhibiting a write operation on the shift field or part 808 is produced; at the same time, an output signal 10-10 is transmitted also to a condition code setting section 10-12 associated with the pertinent instruction.

When a valid input is determined through the input check, a write operation is achieved on the shift field

808. Subsequently, based on the new value of the shift field 808, all entries of the point part or field 807 are rewritten according to the procedure described above. That is, a point field change or update section 10-7 stores "0" in the point field 807 of the first entry of the translation table 806. Thereafter, the values of the shift fields 808 are sequentially read out in the entry order so as to update the value of the entry succeeding the entry of which the shift field has been read out. Assuming the value of the shift field of the entry thus read out and the value of the point field of the pertinent entry are S and P, respectively, a value of $P+2^{14-S}$ is set to the point field 807 of the subsequent entry in this embodiment.

According to the present invention, there is provided means which saves the capacity of the key storage when the number of pages is decreased by increasing the page size, namely, the system is not mounted with the capacity of key storage which is required when the entire real storage is used for the minimum page size. In other words, depending on the manner to set the page size of each bank, the key storage may become insufficient in some cases. The point field update section 10-7 supplies the condition code setting section 10-12 with a signal 10-11 indicating whether or not the value set to the point field 807 exceeds the key storage capacity mounted in the system.

The condition code setting section 10-12 sets, based on the signals 10-10 and 10-11 received from the respective check sections, a condition code 10-13 indicating whether or not the input data 10-1 and 10-2 are valid and whether or not the key storage is sufficient.

The SETKS instruction is used in the initial setting processing when the system is initiated. In the initial setting processing, the page sizes of the respective banks are sequentially established, and based on the condition code finally set for the SETKS instruction, it can be confirmed that the initial setting processing has been normally completed.

Figure 11:
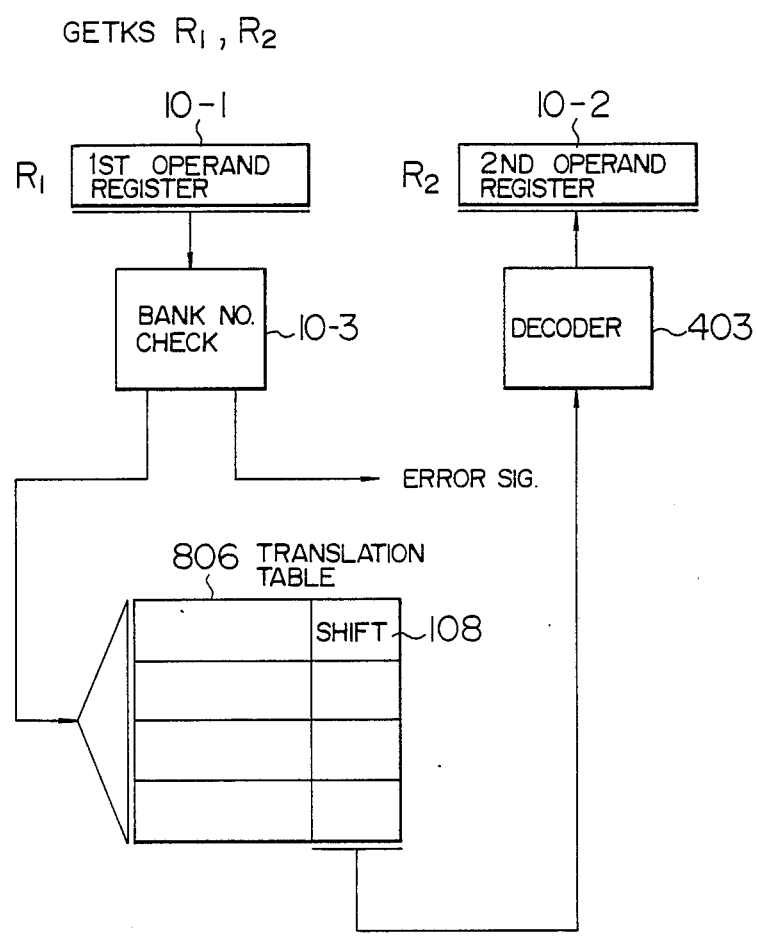

The GETKS instruction is utilized to obtain the page size set for a bank having the specified bank number. Referring now to FIG. 11, the operation of the GETKS instruction will be described. A bank number is specified in the first operand register 10-1. After the bank number check section 10-3 confirms that the specified bank is mounted in the system, an entry of the translation table 806 is selected. The content of the shift field 808 of the selected entry is read out and is converted into a page size by means of the decoder 10-4, and the resultant page size is stored in the second operand register 10-2.

According to the embodiment above of the present invention, in an information processing system including a plurality of page sizes, a single key storage entry can be assigned to pages having different sizes and the key storage entries can be arranged in a compressed form; consequently, the mounted volume of the high-priced key storage can be reduced.

Through a trial calculation according to the embodiment above, in contrast with a case where the entire real storage is subdivided into 4KB pages and 65,536 entries are required to be contained in the key storage, only 33,856 entries are necessary in the case of key storage of the embodiment above. If the capacity of the real storage mounted in the system exceeds several gigabytes ($2^{30}$ bytes) in the future, the ratio of the large-sized pages is considered to be increased, and in such a case, the capacity of the key storage saved according to the present invention is also increased.

While the present invention has been described with reference to the particular illustrative embodiments, it is not restricted by those embodiments but only by the appended claims. It is to be appreciated that those skilled in the art can change and modify the embodiments without departing from the scope and spirit of the present invention.

We claim:

1. A memory system comprising:
   a main storage having a plurality of subdivided areas;
   a key storage including storage keys respectively assigned to said plurality of subdivided areas;
   main storage access control means for controlling accesses to said main storage and to said key storage;
   key address translation means for translating address information of said main storage associated with an access request into address information of an entry of said key storage; and
   setting means operative in association with said key address translation means for setting said area to which said storage key is set.

2. A memory system according to claim 1 wherein
   at least one of said plurality of subdivided areas corresponds to a logical page including a plurality of consecutive real pages having the same size of said main storage in a virtual storage system, and
   said key address translation means includes decision means for determining a representative storage key in a plurality of storage keys included in said logical page.

3. A memory system according to claim 2 further comprising control means, in order to change a size of said logical page and said representative storage key, for changing an internal state of said key address translation means through an execution of a program instruction.

4. A memory system according to claim 1 where said key address translation means includes:
   an address translation table to which a portion of said address information is to be inputted and
   control means for changing and reading a content of said address translation table through an execution of a program instruction.

5. A memory system comprising:
   a main storage having a plurality of subdivided areas wherein at least one of said plurality of subdivided areas corresponds to a logical page including a plurality of consecutive real pages having the same size of said main storage in a virtual storage system;
   a key storage including storage keys respectively assigned to said plurality of subdivided areas;
   main storage access control means for controlling access to said main storage and to said key storage;
   key address translation means for translating address information of said main storage associated with an access request into address information of an entry of said key storage wherein said key address translation means includes decision means comprising a mask bit pattern table to which said real page address is to be inputted and a circuit for obtaining a logical product between an output from said mask bit pattern table and said real page address; and
   setting means operative in association with said key address translation means for setting said area to which said storage key is set.

6. A memory system comprising:

a means storage having a plurality of subdivided areas including equally sized bank areas made up of pages of a size corresponding to said bank areas or of a plurality of sizes;

a key storage including storage keys respectively assigned to said plurality of subdivided areas;

main storage access control means for controlling access to said main storage and to said key storage;

key address translation means including an address translation table to which a portion of said address information is to be inputted and control means for changing and reading the content of said address translation table through an execution of a program instruction for translating address information of said main storage associated with an access request into address information of an entry of said key storage, said address information including a bank number identifying said bank and a page number denoting an order of page in a bank, said address translation table receiving said bank number as an input and having a point part disposed to convert said bank number into a first address of the key storage associated with a page in the bank related to said address information and shift information concerning a page size in said bank;

key address translation means including a circuit for attaining an address of said key storage by use of a signal obtained by shifting said first address and said page number depending on said shift information, for translating address information of said main storage associated with an access request into address information of an entry of said key storage; and setting means operative in association with said key address translation means for setting said area to which said storage key is set.

7. A memory system which controls an access to a real page of a main memory by comparing a storage key associated with the real page to an access key associated with the access, comprising:

(a) real pages provided on said main memory, the real pages being divided into groups;

(b) a key storage including key storage locations respectively associated with the real pages, each key storage location being for holding a storage key; and (c) key storage access means connected to said key storage and responsive to a real address for one of the real pages for accessing a representative one of key storage locations associated with a group of real pages to which the one real page belongs, so that a storage key held in the representative key storage location is commonly used for the group of real pages.

8. A memory system according to claim 7, further comprising control means connected to said key storage access means and responsive to an instruction requiring change of grouping of real pages for informing said key storage access means of a change of grouping of the real pages.

9. A memory system according to claim 7, wherein said key storage access means includes:

a mask bit pattern table for holding mask bit patterns each associated with one of the groups and each for masking a real address for a real page belonging to a corresponding group of real pages; and mask means connected to said mask bit pattern table for masking a real address for one of the real pages, by one of the mask bit patterns associated with one of the groups, held by the mask bit pattern table, so as to generate an address of a representative key storage location associated with the one group of real pages.

10. A memory system which controls an access to a real page of a main memory by comparing a storage key associated with the real page to an access key associated with the access, comprising:

(a) real pages of different sizes provided on said main memory and divided into groups, each group comprising real pages of a same size;

(b) key storage including key storage location divided into groups, each group corresponding to one group of the groups of real pages and each group comprising key storage locations each for holding a storage key assigned to a corresponding real page;

(c) access means connected to said key storage and responsive to one real address for one of the real pages provided on the main memory for accessing one key storage location of said key storage, corresponding to the one real page, said access means including first means responsive to the one real address for generating one starting address of one group of key storage locations corresponding to one group of real pages to which the one real page belongs, and second means connected to said first means and responsive to the one generated starting address and the one real address for generating one address of the one key storage location corresponding to the one real page.

11. A memory system according to claim 10, wherein real pages belonging to a same group are assigned with successive addresses of said main memory; and wherein key storage locations belonging to a same group are assigned with successive addresses of said key storage.

12. A memory system according to claim 10, wherein said first means includes an address translation memory for holding starting addresses of the groups of key storage locations and responsive to the one real address for selectively providing the one starting address of the one group of key storage locations among the held starting addresses.

13. A memory system according to claim 12, wherein said second means including means for adding the one starting address generated by said first means to part of the one real address so as to generate the one address for the one key storage location.

14. A memory system according to claim 13, wherein a total size of each group of real pages are the same among the groups of real pages;

wherein said address translation memory further holds shift data in corresponding to each of the starting addresses;

wherein said second means further includes shift means for shifting part of the one real address by an amount designated by shift data held by said address translation memory in correspondence to the one starting address so as to provide the shifted part of the one real address to said adding means.

15. A memory system which controls an access to a real page of a main memory by comparing a storage key associated with the real page to an access key associated with the access, comprising:
- (a) real pages of different sizes provided on said main memory and divided into groups, each group comprising real pages of a same size;
- (b) key storage including key storage location divided into groups, each group corresponding to one group of the groups of real pages and each group comprising key storage location each for holding a storage key assigned to a corresponding real page;
- (c) access means connected to said key storage and responsive to one real address for one of the real pages provided on the main memory for accessing one key storage location of said key storage, corresponding to the one real page, said access means including first means responsive to the one real address for identifying one group of key storage locations corresponding to one group of real pages to which the one real page belongs, and second means connected to said first means and responsive to the one real address for identifying a key storage location corresponding to the one real page, within the identified group.

16. A memory system according to claim 15,
wherein said first means includes means for identifying a group of key storage locations having a same order of group within the groups of key storage locations as an order of group within the groups of real pages, of one group of real pages to which the one real page belongs; and
wherein said second means includes means for identifying a key storage location having a same order of location within the one group of key storage locations as an order of location of the one real page within the one group of real page.

17. A memory system which controls an access to a real page of a main memory by comparing a storage key associated with the real page to an access key associated with the access, comprising:
- (a) real pages of different sizes provided on said main memory and divided into groups, each group comprising real pages of a same size and of successive addresses of said main memory;
- (b) key storage including key storage locations divided into groups, each corresponding to one group of the groups of real pages and each comprising key storage locations for holding storage keys assigned to corresponding real pages and having successive addresses of said key storage; and
- (c) access means connected to said key storage and responsive to one real page address for one of the real pages provided on the main memory for accessing one key storage location of said key storage, corresponding to the one real page, said access means including first means responsive to a first part of the one real address for identifying one group of key storage locations corresponding to one group of real pages to which the one real page belongs, and second means connected to said first means and responsive to a second part of the one real page address for identifying one key storage location corresponding to the one real page, within the identified group.

18. A memory system according to claim 17,
wherein said first means includes means for identifying a group of key storage locations having a same order of group within the groups of key storage locations as an order of group within the groups of real pages, of one group of real pages to which the one real page belongs; and
wherein said second means includes means for identifying a key storage location having a same order of location within the one group of key storage locations as an order of location of the one real page within the one group of real page.

* * * * *